US011761086B2

United States Patent
Baum et al.

(10) Patent No.: US 11,761,086 B2
(45) Date of Patent: Sep. 19, 2023

(54) COBALT PRECURSORS

(71) Applicant: ENTEGRIS, INC., Billerica, MA (US)

(72) Inventors: Thomas H. Baum, New Fairfield, CT (US); Scott L. Battle, Cedar Park, TX (US); John M. Cleary, New Fairfield, CT (US); David W. Peters, Kingsland, TX (US); Philip S.H. Chen, Bethel, CT (US)

(73) Assignee: ENTEGRIS, INC., Billerica, MA (US)

( * ) Notice: Subject to any disclaimer, the term of this patent is extended or adjusted under 35 U.S.C. 154(b) by 884 days.

(21) Appl. No.: 15/120,844

(22) PCT Filed: Feb. 19, 2015

(86) PCT No.: PCT/US2015/016635
§ 371 (c)(1),
(2) Date: Aug. 23, 2016

(87) PCT Pub. No.: WO2015/127092
PCT Pub. Date: Aug. 27, 2018

(65) Prior Publication Data
US 2016/0369402 A1    Dec. 22, 2016

Related U.S. Application Data

(60) Provisional application No. 62/103,068, filed on Jan. 13, 2015, provisional application No. 61/943,494, filed on Feb. 23, 2014.

(51) Int. Cl.
*C23C 16/50* (2006.01)
*C07F 15/06* (2006.01)
(Continued)

(52) U.S. Cl.
CPC .............. *C23C 16/50* (2013.01); *C07F 15/06* (2013.01); *C23C 16/06* (2013.01); *C23C 16/16* (2013.01);
(Continued)

(58) Field of Classification Search
CPC .................................................. C23C 16/503
See application file for complete search history.

(56) References Cited

U.S. PATENT DOCUMENTS 4,361,497 A    11/1982   Boldt et al.
7,172,967 B2    2/2007   Kim et al.
(Continued)

FOREIGN PATENT DOCUMENTS

JP    2012-172252 A    9/2012
KR    10-2008-0110897 A    12/2008
(Continued)

OTHER PUBLICATIONS

Cunninghame, R., et al., "Electron Transfer in Organometallic Clusters. 12. Regioselective Sequential Electrocatalytic Substitution of [mu-(CF3)2C2]Co2(CO)6 by Polydentate Ligands", "Organometallics", 1987, pp. 1470-1479, vol. 6, No. 7.
(Continued)

*Primary Examiner* — Joel G Horning

(57) ABSTRACT

Cobalt precursors are described, having application for vapor deposition of cobalt on substrates, such as in atomic layer deposition (ALD) and chemical vapor deposition (CVD) processes for forming interconnects, capping structures, and bulk cobalt conductors, in the manufacture of integrated circuitry and thin film products.

17 Claims, 6 Drawing Sheets

(51) Int. Cl.

| | |
|---|---|
| *C23C 16/18* | (2006.01) |
| *C23C 16/16* | (2006.01) |
| *C23C 16/06* | (2006.01) |
| *C23C 16/455* | (2006.01) |
| *C23C 16/48* | (2006.01) |

(52) U.S. Cl.
CPC ........ *C23C 16/18* (2013.01); *C23C 16/45525* (2013.01); *C23C 16/483* (2013.01)

(56) References Cited

U.S. PATENT DOCUMENTS

| | | | |
|---|---|---|---|
| 8,524,600 | B2 | 9/2013 | Lei et al. |
| 8,765,601 | B2 | 7/2014 | Lei et al. |
| 2005/0014365 | A1 | 1/2005 | Moon et al. |
| 2005/0064706 | A1 | 3/2005 | Kim et al. |
| 2007/0202254 | A1 | 8/2007 | Ganguli et al. |
| 2008/0132050 | A1 | 6/2008 | Lavoie |
| 2009/0208637 | A1 | 8/2009 | Chen et al. |
| 2009/0236745 | A1* | 9/2009 | Vrtis ................ C23C 16/02 257/751 |
| 2013/0260555 | A1 | 10/2013 | Zope et al. |
| 2015/0093890 | A1* | 4/2015 | Blackwell ........ H01L 21/28556 438/602 |

FOREIGN PATENT DOCUMENTS

| | | |
|---|---|---|
| WO | 2007121249 A2 | 10/2007 |
| WO | 2007147020 A2 | 12/2007 |
| WO | 2008142653 A2 | 11/2008 |
| WO | 2009012341 A2 | 1/2009 |

OTHER PUBLICATIONS

Georgi, C., et al., "Hexacarbonyl (Trimethylsilyl Ethyne) Dicobalt as MOCVD Precursor for Thin Cobalt Layer Formation", "Zeitschrift Fur Anorganische Und Allgemeine Chemie", Aug. 15, 2013, pp. 2532-2535, vol. 639, No. 14.

Happ, B., et al., "On the Reactivity of Acetylenes Coordinated to Cobalt. 9. Effects of Substitution and Coordination on the 13C-NMR Chemical Shifts of the sp Carbons of (.mu.2-R1C2R2)Co2(CO)6 Complexes. Molecular Structure of (.mu.2-PhC2SiPh3)Co2(CO)6", "Organometallics", Feb. 1995, pp. 809-819, vol. 14.

McDonald, R., et al., "Gas-Phase Ligand Substitution Reactions with (OC)Fe(NO)2'-, (OC),Co(NO)'-, ( eta3-C3H5) Co(CO),', (C3H5)Co(C0)3'-, and CpCo(CO)2'-", "Organometallics", 1988, pp. 1806-1820, vol. 7, No. 8.

Pugh, T., et al., "Cobalt(III) Diazabutadiene Precursors for Metal Deposition: Nanoparticle and Thin Film Growth", "Inorg. Chem.", Nov. 15, 2013, pp. 13719-13729, vol. 52.

Note: For the non-patent literature citations that no month of publication is indicated, the year of publication is more than 1 year prior to the effective filing date of the present application.

\* cited by examiner

COBALT PRECURSORS

CROSS-REFERENCE TO RELATED APPLICATIONS

This application is a U.S. national phase under the provisions of 35 U.S.C. § 371 of International Patent Application No. PCT/US15/16635 filed Feb. 19, 2015, which in turn claims the benefit under 35 USC § 119 of U.S. Provisional Patent Application No. 62/103,068 filed Jan. 13, 2015 in the names of Thomas H. Baum, et al. for "COBALT PRECURSORS" and the benefit under 35 USC § 119 of U.S. Provisional Patent Application No. 61/943,494 filed Feb. 23, 2014 in the names of Thomas H. Baum, et al. for "COBALT PRECURSORS". The disclosures of International Patent Application No. PCT/US15/16635, U.S. Provisional Patent Application No. 62/103,068 and U.S. Provisional Patent Application No. 61/943,494 are hereby incorporated herein by reference, in their respective entireties, for all purposes.

FIELD

The present disclosure relates to cobalt precursors, e.g., cobalt precursors useful in atomic layer deposition (ALD) and chemical vapor deposition (CVD) processes for forming interconnects, capping structures, and bulk cobalt conductors, in the fabrication of semiconductor products, as well as to vapor deposition processes utilizing such cobalt precursors, and products of such vapor deposition processes.

BACKGROUND

As integrated circuitry (IC) device dimensions have continued to shrink, new deposition precursors and processes are increasingly needed to reliably and reproducibly fabricate interconnect and capping structures with high-integrity, electrically interconnected thin films. In particular, with the progression from two-dimensional to three-dimensional structures, integrity and reliability are critical requirements, especially for multi-level interconnects.

Low temperature deposition of cobalt-based thin films is a key aspect of this development in many IC applications, such as microprocessor, logic and memory based devices. As copper interconnects have become more widely adopted, the need for corrosion inhibition has increased in importance. Towards this end, cobalt-based capping films and inter-facial electrode materials have become widely investigated as materials for limiting copper corrosion and enhancing electro-migration in multi-level integrated devices structures, in which cobalt is utilized as an elemental metal or as an alloy (e.g., in alloys such as CoWB or CoWP). Applications are also contemplated utilizing bulk cobalt conductors in integrated circuitry structures.

As feature and linewidth dimensions of integrated circuits decrease, cobalt disilicide has been progressively displacing titanium silicide, since cobalt disilicide does not entail the linewidth dependent sheet resistance issues that are characteristic of titanium silicide. Cobalt also has elicited interest as a result of its magnetic properties for data storage applications and its potential for spintronics applications.

In consequence of this emergence of cobalt as an increasingly important fabrication material in integrated circuitry applications, there is an ongoing search for new chemical precursors for cobalt that have suitable properties for semiconductor manufacturing. Cobalt precursors utilized for vapor deposition processes in such applications must deposit effectively at low temperatures from the gas phase, with good conformality and film characteristics, and must be stable in transport and handling at ambient, e.g., room, temperatures, while decomposing into high-purity cobalt films upon thermal or chemical decomposition at elevated temperature in the deposition process.

The present disclosure relates to cobalt precursors useful for such purpose.

SUMMARY

The present disclosure relates to cobalt precursors for use in vapor deposition processes to deposit cobalt on substrates, as well as to microelectronic device products and precursor structures, and vapor deposition processes related thereto.

The present disclosure relates to cobalt precursors having utility for vapor deposition of cobalt for the fabrication of integrated circuitry devices and precursor structures, as well as such devices and structures, and appertaining processes.

The disclosure in one aspect relates to a cobalt precursor composition comprising a cobalt precursor selected from the group consisting of:

$Co_2(CO)_6[(F_3C)C\equiv C(CF_3)]$;
$Co_2(CO)_6[(H_3C)C\equiv C(C(CH_3)_3)]$;
$Co(CO)_{3-x}(C\equiv C)_xNO$ wherein $x=1-3$;
$Cp(Co)(PF_3)_2$;
$Cp(Co)[P(H)_x(R)_{3-x}]_2$ wherein $x=1-3$ and $R=C_1-C_8$ alkyl;
$CoSiCl_3(PF_3)_4$;
$CoSiCl_3[P(H)_x(R)_{3-x}]_4$ wherein $x=1-3$ and $R=C_1-C_8$ alkyl;
$Co_2(PF_3)_8$;
$Co_2[P(H)_x(R)_{3-x}]_8$ wherein $x=1-3$ and $R=C_1-C_8$ alkyl;
$Co_4(PF_3)_{12}$;
$Co_4[P(H)_x(R)_{3-x}]_{12}$ wherein $x=1-3$ and $R=C_1-C_8$ alkyl;
$Co(PF_3)_3NO$;
$Co[P(H)_x(R)_{3-x}]_3NO$ wherein $x=1-3$ and $R=C_1-C_8$ alkyl;
$(H_3CC[(CH_3)_2]C\equiv C)Co_2[PF_3]_6$;
$(H_3CC[(CH_3)_2]C\equiv C)Co_2(P(H)_x(R)_{3-x})_6$ wherein $x=1-3$ and $R=C_1-C_8$ alkyl;
$Co_2(PF_3)_6[HCC(Si(CH_3)_3)]$;
$Co_2(P(H)_x(R)_{3-x})_6[HCC(Si(CH_3)_3)]$ wherein $x=1-3$ and $R=C_1-C_8$ alkyl;
$Co(PF_3)_{3-x}(C\equiv N)_xNO$ wherein $x=1-3$;
$Co(P(H)_y(R)_{3-y})_{3-x}(C\equiv N)_xNO$ wherein $x=1-3$, $y=1-3$, and $R=C_1-C_8$ alkyl;
$HCo(PF_3)_4$;
$RCo(PF_3)_4$ wherein $R=C_1-C_8$ alkyl;
$HCo(CO)_4$;
$RCo(CO)_4$;
Lewis base adducts of $Co_2(CO)_8$;
$Co(CO)_{6-x}(NO)_x$ wherein $x=1-3$;
cobalt β-diketonato Lewis base adducts;
$RCpCo(CO)_2(NO)$ wherein R is H or $C_1-C_8$ alkyl;
bis(arene) cobalt compounds and complexes;
cobalt nitriles;
Co(II/III) complexes with amines, alkyl amines or bidentate amines;
Co(II/III) complexes with ammonia or $RNH_2$ adducts wherein R is $C_1-C_8$ alkyl;
reaction products of $Co_2(CO)_6(HCC(CH_3)_3)$ and amines; and
reaction products of $Co_2(CO)_6(HCC(Si(CH_3)_3))$ and amines.

A further aspect of the invention relates to a process for depositing cobalt on a substrate, comprising contacting the substrate with cobalt precursor vapor under vapor deposition conditions effective for deposition of cobalt on the substrate, wherein the cobalt precursor comprises a precursor selected from the group consisting of:

$Co_2(CO)_6[(F_3C)C\equiv C(CF_3)]$;
$Co_2(CO)_6[(H_3C)C\equiv C(C(CH_3)_3)]$;
$Co(CO)_{3-x}(C\equiv N)_x NO$ wherein x=1-3;
$Cp(Co)(PF_3)_2$;
$Cp(Co)[P(H)_x(R)_{3-x}]_2$ wherein x=1-3 and R=$C_1$-$C_8$ alkyl;
$CoSiCl_3(PF_3)_4$;
$CoSiCl_3[P(H)_x(R)_{3-x}]_4$ wherein x=1-3 and R=$C_1$-$C_8$ alkyl;
$Co_2(PF_3)_8$;
$Co_2[P(H)_x(R)_{3-x}]_8$ wherein x=1-3 and R=$C_1$-$C_8$ alkyl;
$Co_4(PF_3)_{12}$;
$Co_4[P(H)_x(R)_{3-x}]_{12}$ wherein x=1-3 and R=$C_1$-$C_8$ alkyl;
$Co(PF_3)_3NO$;
$Co[P(H)_x(R)_{3-x}]_3NO$ wherein x=1-3 and R=$C_1$-$C_8$ alkyl;
$(H_3CC[(CH_3)_2]C\equiv C)Co_2[PF_3]_6$;
$(H_3CC[(CH_3)_2]C\equiv C)Co_2(P(H)_x(R)_{3-x})_6$ wherein x=1-3 and R=$C_1$-$C_8$ alkyl;
$Co_2(PF_3)_6[HCC(Si(CH_3)_3)]$;
$Co_2(P(H)_x(R)_{3-x})_6[HCC(Si(CH_3)_3)]$ wherein x=1-3 and R=$C_1$-$C_8$ alkyl;
$Co(PF_3)_{3-x}(C\equiv N)_x NO$ wherein x=1-3;
$Co(P(H)_y(R)_{3-y})_{3-x}(C\equiv N)_x NO$ wherein x=1-3, y=1-3, and R=$C_1$-$C_8$ alkyl;
$HCo(PF_3)_4$;
$RCo(PF_3)_4$ wherein R=$C_1$-$C_8$ alkyl;
$HCo(CO)_4$;
$RCo(CO)_4$;
Lewis base adducts of $Co_2(CO)_8$;
$Co(CO)_{6-x}(NO)_x$ wherein x=1-3;
cobalt β-diketonato Lewis base adducts;
$RCpCo(CO)_2(NO)$ wherein R is H or $C_1$-$C_8$ alkyl;
bis(arene) cobalt compounds and complexes;
cobalt nitriles;
Co(II/III) complexes with amines, alkyl amines or bidentate amines;
Co(II/III) complexes with ammonia or $RNH_2$ adducts wherein R is $C_1$-$C_8$ alkyl;
reaction products of $Co_2(CO)_6(HCC(CH_3)_3)$ and amines; and
reaction products of $Co_2(CO)_6(HCC(Si(CH_3)_3))$ and amines.

In a further aspect, the disclosure relates to a supply package comprising a cobalt precursor of the present disclosure.

Other aspects, features and embodiments of the disclosure will be more fully apparent from the ensuing description and appended claims.

DETAILED DESCRIPTION

Figure 1:
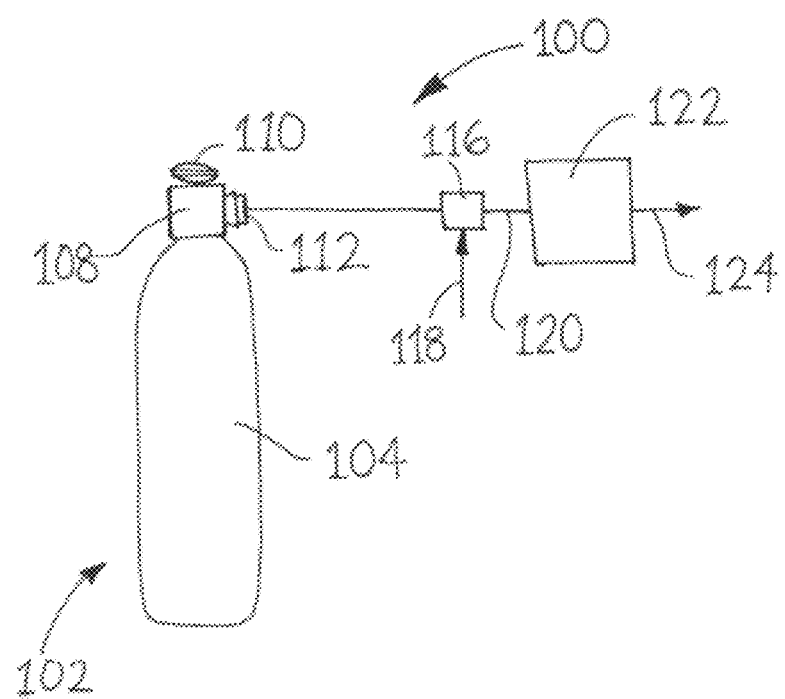
FIG. 1 is a schematic illustration of a semiconductor manufacturing system including a cobalt precursor supply package arranged in precursor delivery relationship to a vapor deposition chamber in which cobalt is deposited on a substrate, according to one embodiment of the present disclosure.

The present disclosure relates to cobalt precursors having utility for vapor deposition of cobalt for the fabrication of integrated circuitry devices and precursor structures, as well as such devices and structures, and appertaining processes.

As used herein and in the appended claims, the singular forms "a", "and", and "the" include plural referents unless the context clearly dictates otherwise.

The disclosure, as variously set out herein in respect of features, aspects and embodiments thereof, may in particular implementations be constituted as comprising, consisting, or consisting essentially of, some or all of such features, aspects and embodiments, as well as elements and components thereof being aggregated to constitute various further implementations of the disclosure. The disclosure correspondingly contemplates such features, aspects and embodiments, or a selected one or ones thereof, in various permutations and combinations, as being within the scope of the present disclosure.

As used herein, the term "film" refers to a layer of deposited material having a thickness below 1000 micrometers, e.g., from such value down to atomic monolayer thickness values. In various embodiments, film thicknesses of deposited material layers in the practice of the invention may for example be below 100, 10, or 1 micrometers, or in various thin film regimes below 200, 100, or 50 nanometers, depending on the specific application involved. As used herein, the term "thin film" means a layer of a material having a thickness below 1 micrometer.

As used herein, the identification of a carbon number range, e.g., in $C_1$-$C_{12}$ alkyl, is intended to include each of the component carbon number moieties within such range, so that each intervening carbon number and any other stated or intervening carbon number value in that stated range, is encompassed, it being further understood that sub-ranges of carbon number within specified carbon number ranges may independently be included in smaller carbon number ranges, within the scope of the invention, and that ranges of carbon numbers specifically excluding a carbon number or numbers are included in the invention, and sub-ranges excluding either or both of carbon number limits of specified ranges are also included in the invention. Accordingly, $C_1$-$C_{12}$ alkyl is intended to include methyl, ethyl, propyl, butyl, pentyl, hexyl, heptyl, octyl, nonyl, decyl, undecyl and dodecyl, including straight chain as well as branched groups of such types. It therefore is to be appreciated that identification of a carbon number range, e.g., $C_1$-$C_{12}$, as broadly applicable to a substituent moiety, enables, in specific embodiments of the invention, the carbon number range to be further restricted, as a sub-group of moieties having a carbon number range within the broader specification of the substituent moiety. By way of example, the carbon number range e.g., $C_1$-$C_{12}$ alkyl, may be more restrictively specified, in particular embodiments of the invention, to encompass sub-ranges such as $C_1$-$C_4$ alkyl, $C_2$-$C_8$ alkyl, $C_2$-$C_4$ alkyl, $C_3$-$C_5$ alkyl, or any other sub-range within the broad carbon number range.

"Alkyls" as used herein include, but are not limited to, methyl, ethyl, propyl, isopropyl, butyl, s-butyl, t-butyl, pentyl and isopentyl and the like. "Aryls" as used herein includes hydrocarbons derived from benzene or a benzene derivative that are unsaturated aromatic carbocyclic groups of from 6 to 10 carbon atoms. The aryls may have a single or multiple rings. The term "aryl" as used herein also includes substituted aryls. Examples include, but are not limited to phenyl, naphthyl, xylene, phenylethane, substituted phenyl, substituted naphthyl, substituted xylene, substituted phenylethane and the like.

"Arenes" as used herein include, refers to aromatic hydrocarbons comprising alternating double and single bonds between carbon atoms forming rings. Such arenes include monocyclic as well as polycyclic rings, such as for example benzene, toluene, ethyl benzene, xylene, mesitylene, durene, phenyl hexane, biphenyl, phenol, aniline, nitrobenzene, benzoic acid, paracetamol, picric acid, naphthalene, and pyrene.

"β-diketonato" ligands utilized in the compositions of the present disclosure may be of any suitable type. Illustrative species and their notational abbreviations include: acac=acetylacetonate, more specifically 2,4-pentanedionate; hfacac (or hfac)=hexafluoroacetylacetonate, more specifically 1,1,1,5,5,5-hexafluoro-2,4-pentanedionate; tfacac (or tfac)=trifluoroacetylacetonate, more specifically 1,1,1-trifluoro-2,4-pentanedionate; thd=tetramethylheptanedionate, and more specifically 2,2,6,6-tetramethyl-3,5-heptanedionate; fod=fluorodimethyloctanedionate, and more specifically 1,1,1,2,2,3,3-heptafluoro-7,7-dimethyl-4,6-octanedionate. Corresponding ketoiminate and β-thioketonate ligands may also be used and are identified consistently with the foregoing β-diketonate ligand notation, by prefixation of "n" and "s" to the corresponding β-diketonate ligand, e.g., nhfac, nthd, shfac, sthd, etc. Thus the β-diketonate ligands employed in compositions of the present disclosure may usefully include acac, thd, fod, tfacac, and hfacac, and their corresponding nitrogen and thio analogs.

"Lewis base" as used herein means a compound or chemical moiety that forms a bond by donating a pair of electrons. The compositions of the present disclosure containing a Lewis base constituent are understood to be devoid of other components that preclude the electron donor character of the Lewis base constituent from being present. Any suitable Lewis base may be employed, such as for example, alkali metal, alkaline earth metal, ammonium, quaternary ammonium, quaternary phosphonium, hydroxides, carbonates, bicarbonates, carboxylates, and the like; amines, which may be of any suitable type, including primary, secondary, tertiary and heterocyclic amines, as well as resinous compositions having such Lewis base functionality incorporated in their polymeric structure. Illustrative bases include, by way of illustration, sodium hydroxide, potassium hydroxide, barium carbonate, barium hydroxide, calcium hydroxide, ammonium hydroxide, sodium benzoate, sodium carbonate, sodium bicarbonate, sodium carboxylate, ethyl amine, diethylamine, triethylamine, tripropylamine, triethanolamine, dibutylamine, tributyl amine, trihexylamine, trioctylamine, dimethylpropylamine, dimethyl hexadecylamine, methyldioctylamine, dimethyl-sec butylamine, imidazole, piperazine, N,N-dimethylaniline, N,N-diethylaniline, N,N-dimethyl-1-naphthylamine, N,N,N',N'-tetramethylethylene diamine, triethylene diarnine (i.e., 1,4'diazabicyclo-[2,2,2]-octane), tetraethylammonium benzoate, tetraethylphosphonium acetate, and the like, as well as resinous compositions having Lewis base functionality incorporated into their polymeric structure such as e.g. solid amine-resins, i.e., solid polymers, including homopolymers, that have pendant amino groups attached to and/or incorporated in their polymeric backbone, and which may be of gel, particulate or macroreticular type.

The precursors of the disclosure may be further specified in specific embodiments by provisos or limitations excluding specific substituents, groups, moieties or structures, in relation to various specifications and exemplifications thereof set forth herein. Thus, the disclosure contemplates restrictively defined compositions, e.g., a composition wherein $R^i$ is $C_1$-$C_{12}$ alkyl, with the proviso that $R^i \neq C_4$ alkyl when $R^j$ is silyl.

The disclosure in one aspect relates to a cobalt precursor composition comprising a cobalt precursor selected from the group consisting of:
$Co_2(CO)_6[(F_3C)C\equiv C(CF_3)]$;
$Co_2(CO)_6[(H_3C)C\equiv C(C(CH_3)_3)]$;
$Co(CO)_{3-x}(C\equiv C)_xNO$ wherein x=1-3;
$Cp(Co)(PF_3)_2$;
$Cp(Co)[P(H)_x(R)_{3-x}]_2$ wherein x=1-3 and R=$C_1$-$C_8$ alkyl;
$CoSiCl_3(PF_3)_4$;
$CoSiCl_3[P(H)_x(R)_{3-x}]_4$ wherein x=1-3 and R=$C_1$-$C_8$ alkyl;
$Co_2(PF_3)_8$;
$Co_2[P(H)_x(R)_{3-x}]_8$ wherein x=1-3 and R=$C_1$-$C_8$ alkyl;
$Co_4(PF_3)_{12}$;
$Co_4[P(H)_x(R)_{3-x}]_{12}$ wherein x=1-3 and R=$C_1$-$C_8$ alkyl;
$Co(PF_3)_3NO$;
$Co[P(H)_x(R)_{3-x}]_3NO$ wherein x=1-3 and R=$C_1$-$C_8$ alkyl;
$(H_3CC[(CH_3)_2]C\equiv C)Co_2[PF_3]_6$;
$(H_3CC[(CH_3)_2]C\equiv C)Co_2(P(H)_x(R)_{3-x})_6$ wherein x=1-3 and R=$C_1$-$C_8$ alkyl;
$Co_2(PF_3)_6[HCC(Si(CH_3)_3)]$;
$Co_2(P(H)_x(R)_{3-x})_6[HCC(Si(CH_3)_3)]$ wherein x=1-3 and R=$C_1$-$C_8$ alkyl;
$Co(PF_3)_{3-x}(C\equiv N)_xNO$ wherein x=1-3;
$Co(P(H)_y(R)_{3-y})_{3-x}(C\equiv N)_xNO$ wherein x=1-3, y=1-3, and R=$C_1$-$C_8$ alkyl;
$HCo(PF_3)_4$;
$RCo(PF_3)_4$ wherein R=$C_1$-$C_8$ alkyl;
$HCo(CO)_4$;
$RCo(CO)_4$;
Lewis base adducts of $Co_2(CO)_8$;
$Co(CO)_{6-x}(NO)_x$ wherein x=1-3;
cobalt β-diketonato Lewis base adducts;
$RCpCo(CO)_2(NO)$ wherein R is H or $C_1$-$C_8$ alkyl;
bis(arene) cobalt compounds and complexes;
cobalt nitriles;
Co(II/III) complexes with amines, alkyl amines or bidentate amines;
Co(II/III) complexes with ammonia or $RNH_2$ adducts wherein R is $C_1$-$C_8$ alkyl;
reaction products of $Co_2(CO)_6(HCC(CH_3)_3)$ and amines; and
reaction products of $Co_2(CO)_6(HCC(Si(CH_3)_3)_3)$ and amines.

A further aspect of the invention relates to a process for depositing cobalt on a substrate, comprising contacting the substrate with cobalt precursor vapor under vapor deposition conditions effective for deposition of cobalt on the substrate, wherein the cobalt precursor comprises a precursor selected from the group consisting of:
$Co_2(CO)_6[(F_3C)C\equiv C(CF_3)]$;
$Co_2(CO)_6[(H_3C)C\equiv C(C(CH_3)_3)]$;
$Co(CO)_{3-x}(C\equiv N)_xNO$ wherein x=1-3;
$Cp(Co)(PF_3)_2$;
$Cp(Co)[P(H)_x(R)_{3-x}]_2$ wherein x=1-3 and R=$C_1$-$C_8$ alkyl;
$CoSiCl_3(PF_3)_4$;
$CoSiCl_3[P(H)_x(R)_{3-x}]_4$ wherein x=1-3 and R=$C_1$-$C_8$ alkyl;
$Co_2(PF_3)_8$;
$Co_2[P(H)_x(R)_{3-x}]_8$ wherein x=1-3 and R=$C_1$-$C_8$ alkyl;
$Co_4(PF_3)_{12}$;
$Co_4[P(H)_x(R)_{3-x}]_{12}$ wherein x=1-3 and R=$C_1$-$C_8$ alkyl;
$Co(PF_3)_3NO$;
$Co[P(H)_x(R)_{3-x}]_3NO$ wherein x=1-3 and R=$C_1$-$C_8$ alkyl;

$(H_3CC[(CH_3)_2]C\equiv C)Co_2[PF_3]_6$;

$(H_3CC[(CH_3)_2]C\equiv C)Co_2(P(H)_x(R)_{3-x})_6$ wherein x=1-3 and $R=C_1-C_8$ alkyl;

$Co_2(PF_3)_6[HCC(Si(CH_3)_3)]$;

$Co_2(P(H)_x(R)_{3-x})_6[HCC(Si(CH_3)_3)]$ wherein x=1-3 and $R=C_1-C_8$ alkyl;

$Co(PF_3)_{3-x}(C\equiv N)_xNO$ wherein x=1-3;

$Co(P(H)_y(R)_{3-y})_{3-x}(C\equiv N)_xNO$ wherein x=1-3, y=1-3, and $R=C_1-C_8$ alkyl;

$HCo(PF_3)_4$;

$RCo(PF_3)_4$ wherein $R=C_1-C_8$ alkyl;

$HCo(CO)_4$;

$RCo(CO)_4$;

Lewis base adducts of $Co_2(CO)_8$;

$Co(CO)_{6-x}(NO)_x$ wherein x=1-3;

cobalt β-diketonato Lewis base adducts;

$RCpCo(CO)_2(NO)$ wherein R is H or $C_1-C_8$ alkyl;

bis(arene) cobalt compounds and complexes;

cobalt nitriles;

Co(II/III) complexes with amines, alkyl amines or bidentate amines;

Co(II/III) complexes with ammonia or $RNH_2$ adducts wherein R is $C_1-C_8$ alkyl;

reaction products of $Co_2(CO)_6(HCC(CH_3)_3)$ and amines; and reaction products of $Co_2(CO)_6(HCC(Si(CH_3)_3)$ and amines.

In one preferred aspect, the disclosure relates to a cobalt precursor selected from among $Co_2(CO)_6[(F_3C)C\equiv C(CF_3)]$ and $Co_2(CO)_6[(H_3C)C\equiv C(C(CH_3)_3)]$, as well as to a process for deposition of cobalt using such cobalt precursors. These cobalt precursors dicobalt hexacarbonyl tert-butyl propyne and dicobalt hexacarbonyl hexafluoro-2-butyne possess good transport and deposition behavior. Dicobalt hexacarbonyl tert-butyl propyne has been found to yield STA residues on the order of 1.5%, and to enable deposition of conductive cobalt films with thickness of ~2 nm.

The cobalt precursors of the present disclosure are readily synthesized within the skill of the art based on the disclosure herein.

Another aspect of the disclosure relates to a process for depositing cobalt on a substrate, comprising contacting the substrate with cobalt precursor vapor under vapor deposition conditions effective for deposition of cobalt on the substrate, wherein the cobalt precursor is delivered to the vapor deposition locus by a liquid delivery process in which the cobalt precursor in a solvent medium is volatilized to form the cobalt precursor vapor. The solvent may comprise a hydrocarbon solvent, such as octane, or other alkane, or any other suitable solvent medium, including solvent mixtures.

Alternatively, the organocobalt source reagent material may be provided in a solid phase that is volatilized to form precursor vapor for deposition of cobalt on a substrate contacted with such vapor. For such purpose, the solid organocobalt source reagent material may be packaged in a suitable vaporizer, e.g., as supported on support surface(s) such as trays in a vaporizer vessel of such vaporizer, as hereinafter described in further detail. In such implementation, the solid phase organocobalt source reagent material may be disposed on the support surface in the vaporizer vessel in any suitable physical or morphological form. For example, the solid phase organocobalt source reagent material may be dissolved in a solvent to form a solution, or suspended in a solvent to form a slurry or suspension, which then is applied to a support surface disposed in or installable in the vaporizer, with the solvent being evaporated from the deposited organocobalt source reagent material to yield a film or layer of the organocobalt source reagent material on the support surface in the vaporizer. The organocobalt source reagent material in other embodiments may be processed as hereinafter described, to form a crusted material on the support surface, wherein a crust of the organocobalt material overlies a bulk interior mass of the organocobalt material and wherein the crust is of a differing character than the bulk interior mass.

In a particular aspect, the present disclosure relates to a supply package of organocobalt compound, comprising an ampoule containing an ultrahigh purity organocobalt compound of the present disclosure.

More generally, the supply package of the organocobalt source reagent material of the present disclosure may be of any suitable type, and such organocobalt precursor may be provided in any suitable form and containment environment in such supply package, as appropriate to store the organocobalt source reagent material during non-dispensing conditions, and to dispense the organocobalt source reagent material from the supply package under dispensing conditions, e.g., in a fluid form to flow circuitry coupled with the supply package for flow to a downstream fluid-utilizing apparatus or process.

Referring now to the drawings, FIG. 1 is a schematic illustration of a semiconductor manufacturing system including a cobalt precursor supply package arranged in precursor delivery relationship to a vapor deposition chamber in which cobalt is deposited on a substrate, according to one embodiment of the present disclosure.

The system 100 includes a fluid storage and dispensing package 102 comprising a vessel 104 containing cobalt precursor of the present disclosure. The cobalt precursor may be contained in the vessel 104 in any appropriate phase, e.g., solid, liquid, or gas.

The vessel 104 for such purpose may comprise an empty solid or fluid retention vessel, or alternatively, the vessel may contain a storage medium for the cobalt precursor, such as a solid-phase physical adsorbent medium, e.g., a carbon, silica, alumina, or molecular sieve adsorbent, or, alternatively, an ionic liquid storage medium. Adsorbent-based storage and dispensing packages are commercially available from Entegris, Inc. (Billerica, Mass., USA) under the trademark SDS. Solid precursors may be provided in a solid delivery package such as the ProE-Vap® vaporizer package commercially available from Entegris, Inc. (Billerica, Mass., USA). Fluid precursors may be provided in a fluid delivery package such as the package commercially available from Entegris, Inc. (Billerica, Mass., USA) under the trademark VAC, comprising a pressure-regulated vessel, e.g., a vessel in which at least one pressure regulator is internally disposed in an interior volume of the vessel, and arranged to control dispensing of fluid from the vessel.

The storage medium in a cobalt precursor package containing such medium may be of any suitable type. Storage media useful for such purpose include solid physical adsorbent material, on which the cobalt precursor is adsorptively retained for storage of the precursor in the vessel, and from which the cobalt precursor is desorbed under dispensing conditions to supply the precursor to a downstream cobalt precursor-utilizing facility. Dispensing conditions for effecting desorption of cobalt precursor from the adsorbent on which it is adsorbed may include any one or more of heating of the adsorbent, reduced pressure-mediated desorption of the cobalt precursor from the adsorbent, flow through the vessel of a carrier gas establishing a mass transfer gradient to effect desorption of cobalt precursor from the adsorbent, or any combination of two or more of the foregoing desorption modalities, or any other suitable conditions effecting dispensing of the cobalt precursor from the adsorbent. The adsorbent material may for example comprise a molecular sieve, macroreticulate resin, carbon adsorbent material, silica, alumina, etc., and the vessel may comprise a physical adsorbent storage and dispensing vessel of a type commercially available from Entegris, Inc. (Billerica, Mass., USA) under the trademark SDS.

Other storage media potentially useful in the broad practice of the present disclosure include ionic liquids, which are usefully employed to react with the cobalt precursor so that the precursor is stored as a reaction product in the ionic liquid medium, such reaction being reversible, so that the cobalt precursor may be liberated from the ionic liquid by a reverse reaction under dispensing conditions, e.g., heating of the ionic liquid, exposing the ionic liquid to reduced pressure conditions, flowing a carrier gas through the ionic liquid to entrain the cobalt precursor vapor therein, or a combination of two or more of such modes of dispensing.

Under the dispensing conditions, the dispensing valve in the valve head 108 of the cobalt precursor-containing vessel 104 is opened, e.g., by manual rotation of the hand wheel 110, to discharge cobalt precursor at the outlet port 112. The dispensing valve in the valve head 108 may alternatively be actuated by an automatic actuator arranged for translating the valve from a closed to an open position, so that cobalt precursor flows through the outlet port 112 to the dispensing line 120.

For such dispensing, solid cobalt precursor is appropriately sublimed or otherwise vaporized to form precursor vapor. In instances in which the cobalt precursor is provided in a liquid form, the liquid cobalt precursor is appropriately vaporized. Vapor phase cobalt precursor may be produced in any suitable manner, dependent on the initial phase of the cobalt precursor that is stored in the vessel 104.

The cobalt precursor dispensed from the vessel 104 flows in dispensing line 120 to the mixing chamber 116, in which the cobalt precursor may optionally be mixed with a co-flow component introduced in line 118 to the mixing chamber. The cobalt precursor then flows in dispensing line 120, with or without such a co-flow component, to the vapor deposition chamber 122.

In the vapor deposition chamber 122, the cobalt precursor vapor is contacted with a substrate under vapor deposition conditions effective for depositing cobalt on the substrate from such vapor. The temperature, pressure, and flow rate conditions of the precursor vapor and the conditions obtaining in the vapor deposition chamber may be readily determined, as effective for achieving suitable deposition of cobalt on the substrate in a conformal film of appropriate thickness. Waste gases are discharged from the deposition chamber 122 in vent line 124, and may be passed to scrubbing or other abatement treatment unit operations, and/or recovery or recirculation operations.

In cobalt deposition processes of the type described above, wherein co-flow components are employed, the co-flow component may be of any suitable type, and may for example comprise a carrier gas, such as one or more of argon, xenon, krypton, helium, hydrogen, nitrogen, carbon monoxide, oxygen, carbon dioxide, etc., or a co-flow precursor for concurrent deposition of another metal to form a mixed metal alloy comprising cobalt on the substrate. The co-flow component may additionally, or alternatively, include a cleaning gas, such as $F_2$, $NF_3$, $XeF_2$, or other co-flow component.

Vapor deposition processes utilizing cobalt precursors of the present disclosure may be of any suitable type. Vapor deposition processes useful in the broad practice of the present disclosure include chemical vapor deposition (CVD), atomic layer deposition (ALD), and assisted techniques of such type, including photo-assisted, plasma-assisted, laser-assisted, and other assistive processes.

Process conditions for the vapor deposition process can be readily determined within the skill of the art, based on the disclosure herein, for the specific cobalt precursor utilized in a given process. The precursors can be characterized for such processes by appropriate techniques, including, without limitation, NMR, FTIR, isothermal thermal gravimetric analysis (TGA), TGA-mass spectrometry (MS), gas chromatography, etc. to determine their stability, volatilization, transport, and deposition properties.

Figure 2:
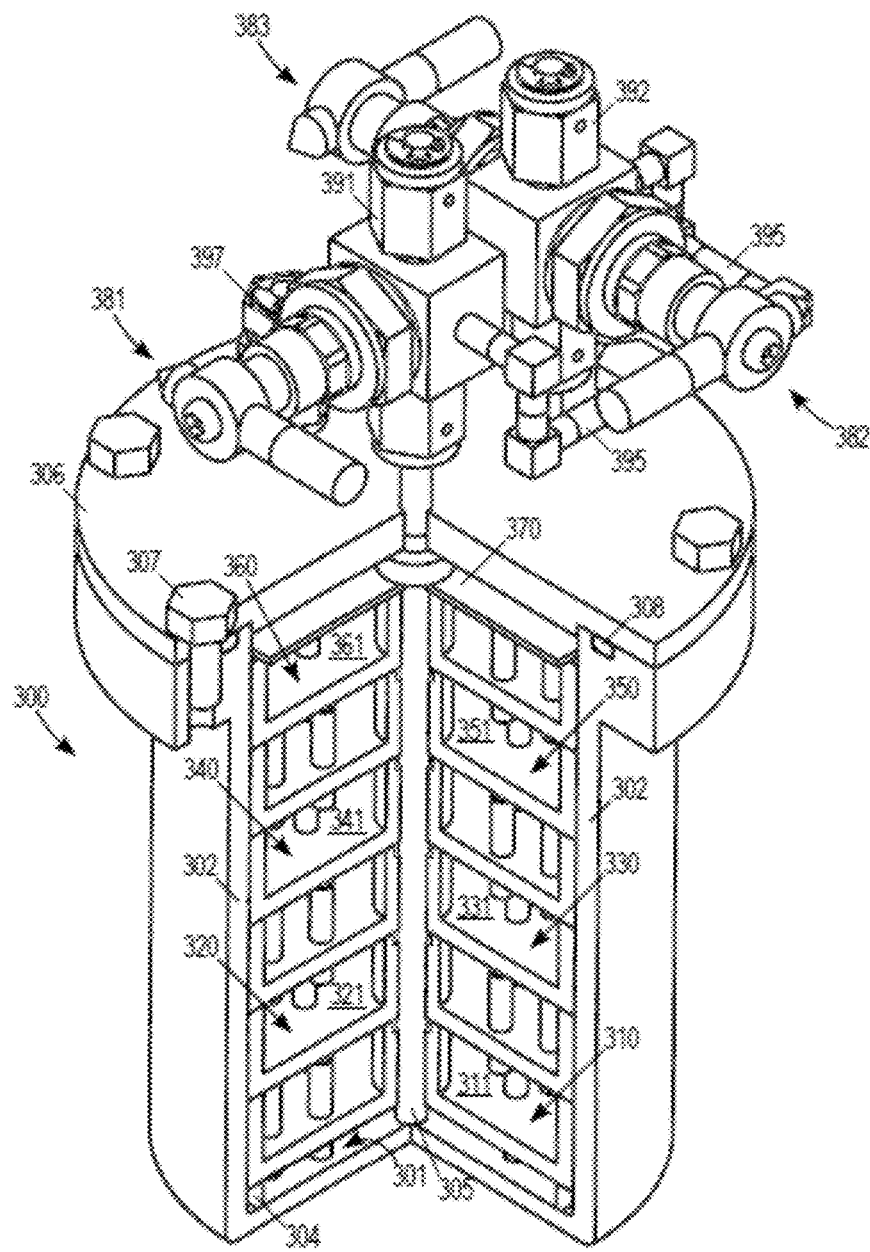
FIG. 2 is a perspective partial sectional view of a vaporizer having trays arranged to promote contact of a gas with vapor from material supported by the trays.

FIG. 2 is a perspective partial sectional view of a vaporizer 300 having a plurality of trays 310, 320, 330, 340, 350, and 360 defining respective support surfaces 311, 321, 331, 341, 351, and 361. The vaporizer may define one or more interior regions in which one or more trays may be provided, and the vaporizer may have one or more sidewalls, a bottom wall, and/or a top wall to define an interior region of any suitable size and shape.

Figure 3:
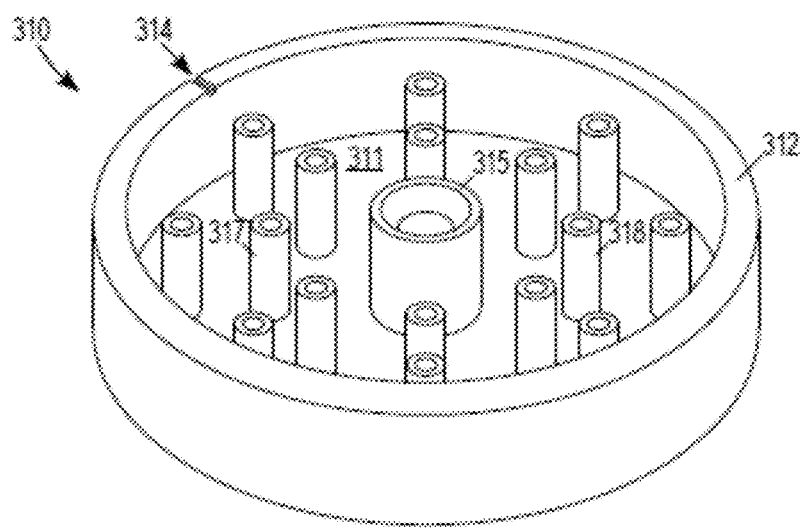
FIG. 3 is a perspective view of a tray of a type utilized in the FIG. 2 vaporizer.
Figure 4:
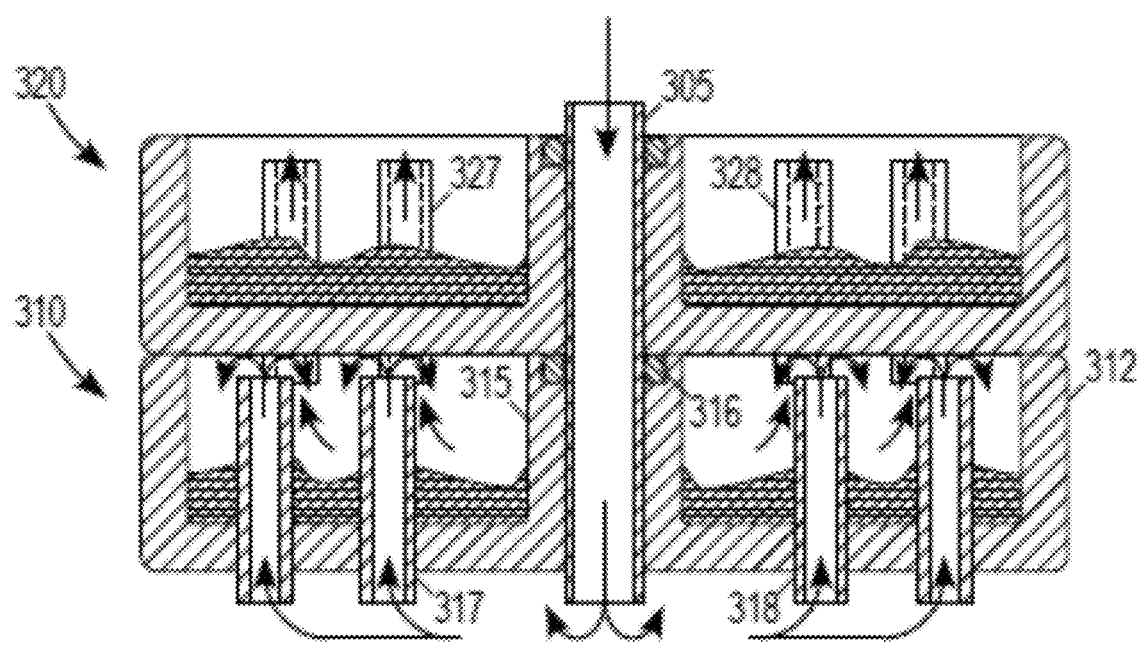
FIG. 4 is a cross-sectional view of a tray positioned over another tray.

FIG. 2 is a perspective partial sectional view of a vaporizer having trays arranged to promote contact of a gas with vapor from material supported by the trays, according to another embodiment of the disclosure. FIG. 3 is a perspective view of a tray of a type utilized in the FIG. 2 vaporizer, and FIG. 4 is a cross-sectional view of a tray positioned over another tray.

As illustrated in FIG. 2, vaporizer 300 may have a bottom wall having a surface 301 and a sidewall 302 that serve to define a generally cylindrical interior region in the vaporizer with a generally circular opening at or near the top of the vaporizer. In specific embodiments, the inner diameter of the generally cylindrical interior region may be in a range of from approximately 3 inches to approximately 6 inches, e.g., approximately 3.75 inches. In other embodiments, the vaporizer may have a bottom wall (floor) and four sidewalls serving to define a generally parallelepiped-shaped interior region in the vaporizer, with a generally rectangular opening at or near the top of the vaporizer, opposite the bottom wall.

It will be recognized that the vaporizer may have any suitable size and shape that is advantageously employed in the desired end use. The vaporizer is adapted to be heated, through its walls or otherwise, by any suitable heating modality, e.g., conduction, convection, radiation, resistive heating, chemical heating, etc. The vaporizer may be formed of any suitable material(s) of construction, including, without limitation, stainless steel, aluminum, aluminum alloys, copper, copper alloys, silver, silver alloys, lead, nickel clad, graphite, ceramic material, hastelloy, inconel, monel, polymer(s), etc., and combinations, mixtures, and alloys of the foregoing, e.g., using composite materials, layered materials, and/or lined materials. The vaporizer may be formed with an integral body, or constructed with a body of multi-piece construction, as desired. The vaporizer may in various embodiments be configured as an ampoule for vaporizing the organocobalt source reagent material to form organocobalt vapor for delivery to processing equipment or a downstream organocobalt vapor-utilizing process.

The organocobalt source reagent material may be provided in any suitable form in the interior volume of the vaporizer, and may be supported by one or more support elements or structures. In various embodiments, the support structure for the organocobalt source reagent material may comprise one or more trays mounted or otherwise disposed in the interior volume of the vaporizer. The trays may be defined, positioned, and/or coupled in any suitable manner to increase exposed surface area of the organocobalt source reagent material, in relation to surface area that would be exposed if the same amount of organocobalt source reagent material were simply introduced into the vaporizer vessel to repose on the bottom surface in such interior volume without any trays or supplemental support structure therein. In various embodiments, the organocobalt source reagent material may be supported on one or more trays in the interior volume, as well as being provided on the bottom surface of the vaporizer.

A plurality of trays may be provided to define a corresponding plurality of support surfaces at various levels in the vaporizer. As illustrated in FIG. 2, tray 310 may be positioned over bottom surface 301 to define support surface 311 over bottom surface 301, tray 320 may be positioned over tray 310 to define support surface 321 over support surface 311; tray 330 may be positioned over tray 320 to define support surface 331 over support surface 321; tray 340 may be positioned over tray 330 to define support surface 341 over support surface 331; tray 350 may be positioned over tray 340 to define support surface 351 over support surface 341; and tray 360 may be positioned over tray 350 to define support surface 361 over support surface 351. Although illustrated in FIG. 2 as employing six trays 310, 320, 330, 340, 350, and 360, it will be recognized that any other suitable number of trays, e.g., three, four, or five, or any other number, may be used in other embodiments. In lieu of trays of the form shown, the vaporizer may be provided with a series of fritted plates as support structures.

Any suitable amount of organocobalt source reagent material may be provided in any suitable state or states and/or form(s). The organocobalt source reagent material may be placed or formed over, on, and/or in one or more trays in any suitable manner, e.g., in a manual manner or in an automated manner utilizing suitable equipment. When the organocobalt source reagent material comprises a solid, such material may be in any suitable form, as for example, a powder, agglomerated particles, one or more crystalline bodies, and/or a film.

The organocobalt source reagent material in one embodiment may be provided in a bag formed of suitable material, such as a fluid-permeable membrane material, to support the organocobalt source reagent material to be vaporized in the bag while allowing a suitable gas to flow into the bag and/or vapor from the organocobalt source reagent material in the bag to flow out of the bag. The bag may be provided on a suitable support surface in the interior volume of the vaporizer.

The organocobalt source reagent material to be vaporized may be coated, in a film or other form, on a support surface in the interior volume of the vaporizer. For example, an organocobalt source reagent may be melted, applied over one or more support surfaces, and then cooled. In other embodiments, the organocobalt source reagent may be dissolved in a solvent and applied over one or more support surfaces followed by removal of the solvent.

When the vaporizer is formed with trays as support surface members, the trays may be removable from the vaporizer to enable cleaning and/or refilling of such trays. The organocobalt source reagent material may be introduced to the tray before, while, or after the tray is placed in the interior volume of the vaporizer. The trays may be formed so as to be stackable, i.e., to form a stacked array of trays in the vaporizer. The stacked array thus may be formed by placing a first tray in the vaporizer, a second tray on top of the first tray, a third tray on top of the second tray, etc. The successive trays may be positioned so that an upper adjacent tray rests directly on a lower adjacent tray, or an intervening gasket or other interposed structure or element may be provided between such adjacent trays. The trays may be formed with interlocking structure facilitating their coupling or mating with one another to form the desired organocobalt source reagent material support structure.

The trays in various embodiments may be formed with cylindrical peripheral walls providing bearing surfaces at their upper and lower extremities enabling the trays to be readily stacked on one another. The trays may be formed with a transverse extent, e.g., diameter, which is of a dimensional character closely approximating the transverse dimensions of the vaporizer, so that the trays are in close proximity to the vaporizer vessel wall. Alternatively, the trays may be formed with protrusions or other extension elements or members that provide contact with the wall to facilitate conduction through the tray to vaporize the organocobalt source reagent material on the tray.

In various embodiments, the vaporizer vessel itself may be formed with structure to support or position trays in the vaporizer, such as radially inwardly extending mounting shelf elements that cooperate with radially outwardly extending flanged elements on the trays to mount the tray in the desired position. In general, the vessel and trays may be formed in any suitable manner to facilitate mounting of the trays in the vessel.

As noted above, the organocobalt source reagent material may be provided on the trays or other support surfaces in the vaporizer vessel, in any suitable manner. In specific embodiments, the material to be vaporized may be provided on the tray or other support surface in a dry box or glove box, with the tray or other support surface member then being installed in the vaporizer while in the dry box or glove box, in order to reduce, minimize, or avoid reaction of the material with air, oxygen, moisture or other components of the ambient environment.

Trays employed in the vaporizer may define one or more support surfaces with any suitable size, contour, and shape. The tray as indicated above may have one or more sidewalls and/or one or more structural portions serving to assist their being mounted in the interior volume of the vaporizer at a specific location, e.g., in relation to the vaporizer vessel interior wall surface and/or other trays in such interior volume.

As illustrated in FIG. 3, tray 310 may define a generally planar support surface 311 generally circular in shape and may have a generally cylindrical sidewall 312 along the perimeter of support surface 311. The tray may be formed of any suitable material of construction, and such material may be the same as the material of construction of the vaporizer vessel, such as for example stainless steel, aluminum, aluminum alloys, copper, copper alloys, silver, silver alloys, lead, nickel clad, graphite, ceramic material, hastelloy, inconel, monel, polymer(s) etc. and combinations, alloys, and mixtures of two or more of the foregoing, and the trays may comprise composite materials, layered materials, lined materials, etc.

Although tray 310 is illustrated in FIGS. 2 and 3 as having an integral body defining support surface 311 and sidewall 312, the trays may be formed from separate pieces to define one or more support surfaces and/or one or more sidewalls and/or one or more supports. As illustrated in FIGS. 2 and 3, vaporizer 300 may have sidewall 302 to help define a generally cylindrical interior region, and tray 310 may have a generally cylindrical sidewall 312, the outer surface of which may be used to help provide thermal contact with the inner surface of sidewall 302 when the tray 310 is positioned in vaporizer 300.

The vaporizer and trays may be manufactured to allow a clearance between the inner surface of one or more sidewalls of the vaporizer and the outer surface of one or more sidewalls of a tray to be in a predetermined range, such as in the range of from approximately 1/1000th of an inch to approximately 3/1000th of an inch for example. The placement of one or more trays in the vaporizer and/or the removal of one or more trays from the vaporizer may be facilitated in specific applications by cooling the tray(s) relative to the vaporizer and/or heating the vaporizer relative to the tray(s). The trays may be formed using material having a larger coefficient of thermal expansion relative to material used to form the vaporizer to facilitate increased clearance between the inner surface of a sidewall of the vaporizer and the outer surface of the sidewall of a tray at relatively lower temperature, e.g., room temperature, while promoting thermal contact between the inner sidewall of the vaporizer and the outer surface of a sidewall of a tray at relatively higher temperatures at which the organocobalt precursor is volatilized.

Gas may be introduced at any suitable flow rate into one or more interior regions of a vaporizer at any suitable location or locations. Gas may for example be introduced into an interior region of a vaporizer at or near one end in the interior region to flow toward another end in the interior region. In specific embodiments, gas may be introduced into an interior region of a vaporizer at or near a bottom surface of the interior region and/or a lowermost tray supporting material to be vaporized in the interior region. Alternatively, gas may for example be introduced between the lowermost tray supporting material to be vaporized and the bottom surface of the interior region, or between the lowermost tray supporting material to be vaporized and a next lowermost tray supporting material to be vaporized in the interior region.

Gas may be introduced into an interior region of the vaporizer in any suitable manner utilizing gas flow elements such as conduits, passageways, ports, etc. In specific embodiments, a carrier gas tube may be provided, extending from a suitable location at or near the top of the interior volume of the vessel to a location at or near the bottom surface of the interior volume and/or lowermost tray supporting material to be vaporized in the interior volume. The tube may extend through a top wall or cover of the vaporizer, and may extend through successive trays in the interior volume.

As illustrated in FIG. 2, a generally annular support 304 may be placed on the bottom surface 301 in the interior region of vaporizer 300 to support tray 310 above the bottom surface 301. A tube 305 may then extend through openings in trays 360, 350, 340, 330, 320, and 310 in a generally central portion of the interior region of vaporizer 300 to a location between tray 310 and bottom surface 301. In other embodiments, the carrier gas tube may terminate at any other suitable location in the interior volume of the vaporizer vessel.

As illustrated in FIGS. 2, 3, and 4, tray 310 may define through a generally central region of support surface 311 a generally circular opening through which tube 305 may extend. The tray may have a generally cylindrical sidewall 315 along the perimeter of that opening with a groove at the top of sidewall 315 to help position an O-ring 316 between tray 310 and tube 305 and between tray 310 and tray 320.

In lieu of a single carrier gas introduction tube, multiple gas introduction tubes may be employed, or a single tube may be employed with multiple outlet arms, or diffuser or sparger members at a lower end thereof.

The vaporizer may be arranged for up flow, or alternatively down flow, of carrier gas through the interior volume of the vaporizer vessel, in various embodiments of the disclosure.

Introduced gas may be directed to flow in any suitable manner over and/or through the organocobalt source reagent material supported by the support surface on the trays or other support member in the interior region of the vaporizer vessel, to maximize contact time of introduced gas with the organocobalt source reagent material being vaporized. Introduced gas may be directionally flowed to contact the organocobalt source reagent material in the vaporizer vessel, using any suitable structure. For example, the FIG. 2 vaporizer may be modified by coupling a baffle or diffuser at the end of tube 305 to help direct gas flow over material supported on bottom surface 301.

The trays in the vaporizer vessel may be configured with any suitable passageways through which gas may flow through the tray. The passageways may be configured so that the gas flow ensures contact and thorough mixing with the vapor deriving from the organocobalt source reagent material. The tray may be configured with support surface openings of any suitable size and shape, and such passageways may include one or more sidewalls that extend upwardly from the support surface along at least a portion of the perimeter of such opening to define the passageway for gas flow through the tray. The sidewalls may be configured to assist in containing the organocobalt source reagent material supported by the tray, and such sidewalls may be configured to assist in directing flow so that gas circulates over material supported by the tray. The sidewalls may be integrally formed with the support member of the tray, or the sidewalls may be part of a multicomponent assembly of the tray.

As illustrated in FIGS. 3 and 4, tray 310 may define a generally circular opening through support surface 311, and a tube 317 may be inserted in that opening to define a generally cylindrical sidewall to extend up from support surface 311 along the perimeter of that opening to define a generally cylindrical passageway through tray 310. Tube 317 may have any suitable size and shape and may define a passageway of any suitable size and shape. Tube 317 may be formed from any suitable material, such as stainless steel for example, and may be inserted in an opening in support surface 311 using any suitable technique. Tube 317 may for example be press fit into an opening in support surface 311, or such tube may have an outer threaded surface and may be screwed into an opening in support surface 311.

The sidewalls of the passageways may define one or more generally conical passageways that taper as the sidewalls extend upwardly from a support surface of the tray, thereby serving to reduce, minimize, or avoid backflow of gas in the operation of the vaporizer. The width and/or thickness of such sidewalls may also taper as the sidewalls extend upwardly from the support surface of the tray.

In various embodiments, the passageway sidewall may define one or more vents that allow gas to flow radially through such sidewalls, and through and/or over the organocobalt source reagent material supported by the support surface of the tray. Passageways in respective adjacent stacked trays may be oriented or otherwise positioned to assist the maximization of contact time of the introduced gas with the organocobalt source reagent material being vaporized.

In such stacked or overlying arrangement, a superjacent tray may be positioned or oriented relative to a subjacent tray so that respective passageways of the trays are non-aligned, to thereby maximize the gas flow path length, and to avoid anomalous flow behaviors such as bypassing or short-circuiting. For such offset orientation of respective trays, the trays may be provided with suitable alignment or coupling structure to assist in achieving the desired orientation of the respective trays. For example, in FIG. 3, a notch 314 may be provided at the top of sidewall 312 to receive a corresponding protuberance extending downwardly from the bottom portion of a superjacent tray, to assist in orientation of the superjacent tray relative to tray 310.

When passageways are provided in the trays, the passageway sidewalls may be of any suitable height to define an exit region of any suitable size between the passageway sidewall(s) on the bottom of a superjacent tray, to allow gas flow to exit one or more passageways through the subjacent tray and/or to assist circulation or direction of gas flow over material supported by the subjacent tray. The trays may be configured so that passageway sidewalls extend outwardly from the bottom of a tray, to assist in directing or circulating gas to a successive superjacent tray. The tray may in various embodiments be configured with passageways defined by sidewalls that extend upwardly as well as below the support surface member of the tray.

As shown in FIGS. 2 and 4, tray 320 may define a generally circular opening through support surface 321, and a tube 327 may be inserted in that opening to define a generally cylindrical sidewall to extend downwardly from the bottom of tray 320 along the perimeter of that opening, thereby defining a generally cylindrical passageway through tray 320. Tube 327 may have any suitable size and shape, and may define a passageway of any suitable size and shape. Such tube may be formed of any suitable material, e.g., stainless steel, and may be inserted in an opening in support surface 321 using any suitable means or technique. For example, the tube 327 may be press fit into an opening in support surface 321, or it may have an outer threaded surface and be screwed into an opening in the support surface 321. The threaded engagement may enable the tube to be adjusted in position, to assist in optimizing gas flow and/or contact time of gas interacting with the organocobalt source reagent material being vaporized.

As also illustrated in FIGS. 2 and 4, tube 327 may be inserted through an opening in support surface 321 of tray 320 to define both a cylindrical sidewall extending upwardly from support surface 321 along the perimeter of that opening and a cylindrical sidewall extending downwardly from the bottom of tray 320 along the perimeter of that opening.

The tray passageways in specific embodiments may be of uniform height, as regards their dimensional extent in relation to the tray support member, or tray passageways may be of differing heights in relation to one another, to provide for directionalized flow of carrier gas in contact with the organocobalt source reagent material being vaporized. For example, the tops of tubes 317 and 318 of tray 310 may be higher than the bottoms of tubes 327 and 328 for tray 320, to assist in directing gas flow for contact with the organocobalt source reagent material supported by tray 310.

The tray passageways in other embodiments may be provided with a cover over the top of the passageway to assist in directing gas flow radially through one or more vents defined between the cover and the passageway sidewall, or otherwise located in the sidewall. Such configuration may enable the respective trays to be positioned or oriented relative to one another with reduced or minimal concern for avoidance of alignment of passageways.

Figure 5:
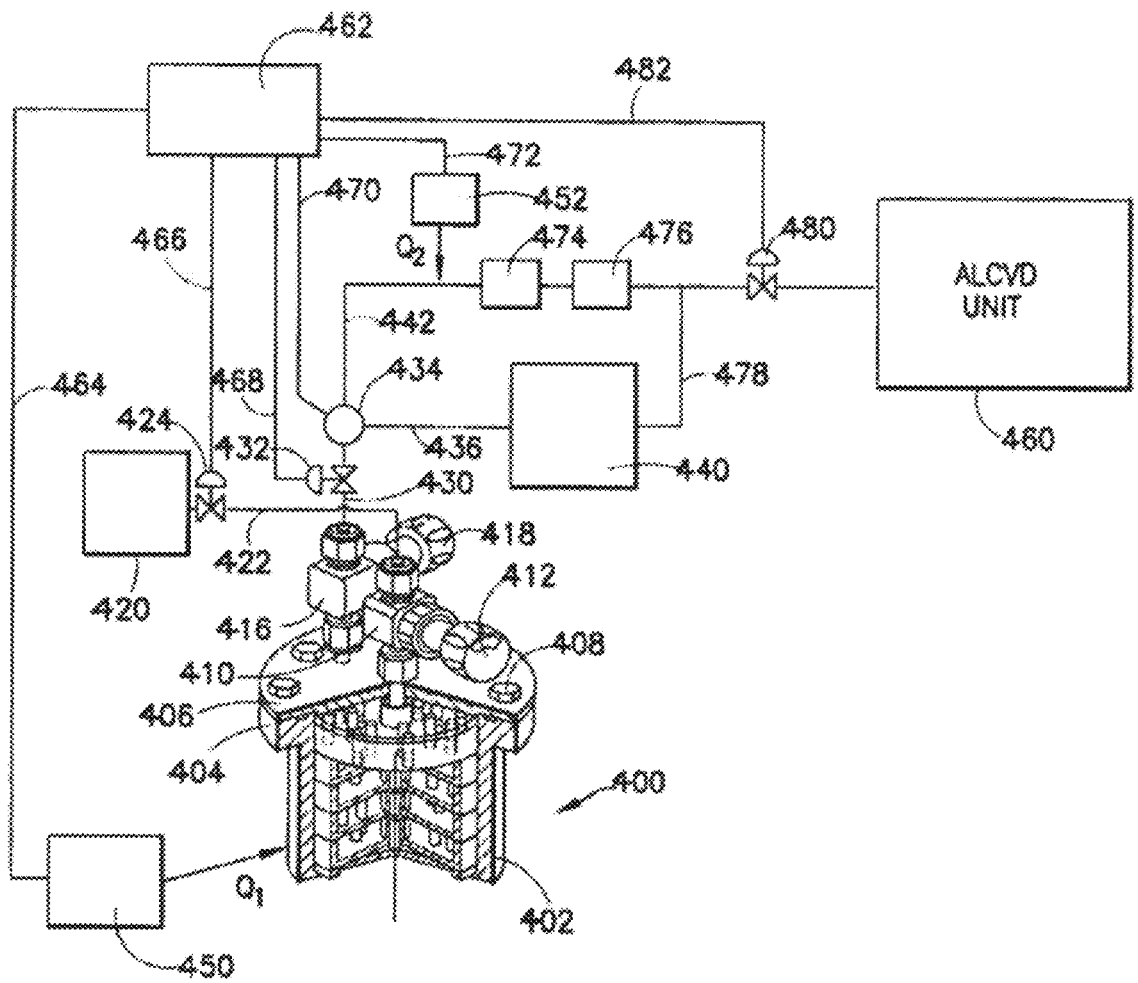
FIG. 5 is a schematic representation of a semiconductor manufacturing facility, utilizing a vaporizer in accordance with one embodiment of the present invention.

FIG. 5 is a schematic representation of a semiconductor manufacturing facility, utilizing a vaporizer 100 in accordance with a further embodiment of the present disclosure.

The vaporizer 400 includes a vessel 402 fabricated of metal or other heat-conducting material, in which the side wall of the vessel terminates at an upper end in a radially outwardly extending flange 404. A cover 406 is positioned on the flange 404 and secured by mechanical bolt fasteners 408. Inlet and outlet valves are mounted on the cover. The inlet valve 410 is equipped with a hand wheel 412, for translation of the valve element in the interior of the valve body, between a fully opened and a fully closed position. The inlet valve 410 alternatively can be an automatically actuatable type valve, coupleable with a pneumatic, electrical or other automatic valve actuator.

The inlet valve 410 is coupled with a downtube, as illustrated, to convey carrier gas into a lower portion of the vessel for flow outwardly and upwardly in the interior volume of such vessel. The vaporizer also includes an outlet valve 416 including a hand wheel 418 for adjusting the flow rate of carrier gas mixture containing volatilized material deriving from the organocobalt solid source reagent in the vessel 402. The valve 416 includes a valve element that is selectively actuatable by the hand wheel 418, for translation between a fully open and a fully closed position. As in the case of the inlet valve, the outlet valve 416 can be an automatically actuatable type, coupleable with a pneumatic, electrical or other automatic valve actuator.

In the vessel 402 is mounted a series of trays or other added surface elements providing support for the organocobalt solid source reagent therein. The trays in the illustrated embodiment are provided with an array of tubes extending through the tray, for passage of fluid therethrough. The tubes in vertically adjacent trays are off-set in relation to one another, so that the carrier gas flows along an extended path, i.e., a tortuous path, to maximize entrainment by the carrier gas of the vapor deriving from the source reagent material.

The source reagent material itself may be provided in any appropriate form, such as granules, pellets, porous solid bodies, etc., whereby the contacting of the carrier gas fluid with the solid results in entrainment of vapor from the solid. The vessel 402 is heated by a heater 450, which as schematically shown, introduces a heat flux $Q_1$ to the vessel.

The inlet valve 410 of the vaporizer is coupled to a feed line 422 having flow control valve 424 therein. The feed line is coupled at an opposite end from the inlet valve, to a source 420 of carrier gas. The flow control valve 424 may be manually operated, or it may as illustrated be coupled via signal transmission line 466 to the central processing unit 462.

The central processing unit may comprise a programmable computer, microprocessor, logic device, programmable logic controller, or the like, as adapted to provide a control signal transmitted in line 466 for opening or closing of valve 424 to a desired extent accommodating flow of carrier gas from source 420 through feed line 422 to the vaporizer 400.

The outlet valve 416 of the vaporizer is joined by discharge line 430 having flow control valve 432 therein, to a three-way valve 434 by which flow from discharge line 430 can be selectively flowed to one of lines 436 and 442.

In a first position, the valve 434 couples discharge line 430 with bypass line 436. Line 436 in turn is coupled with solids removal unit 440, which functions to remove particulate solids from the carrier gas mixture containing the source reagent vapor, to discharge a solids-depleted stream in discharge line 478.

The solids removal unit 440 may comprise a filter, cyclone, solids precipitator such as an electrostatic precipitator, screen, mesh, or other solids retention or row mobile element serving to reduce the solids content of the fluid introduced from line 436, so that the vapor-containing fluid stream discharged from the solids removal unit in line 478 is depleted in solids content to a desired extent, preferably being substantially completely free of a particulate solids therein.

The three-way valve 434 in a second position couples discharge line 430 with feed line 442 in which fluid is passed to the atomic layer deposition (ALD) unit 460, for use in the atomic layer deposition operation carried out in such unit.

The feed line 442 as illustrated contains filters 474 and 476 in series with one another, to ensure particle removal from the fluid stream being sent to the ALD unit. The filters 474 and 476 may be utilized in combination with the solids removal unit 440 to achieve a predetermined low solids level in the fluid stream passed to the ALD unit, or alternatively only one of such filters 474 and 476 may be disposed in feed line 442.

The feed line 442 is schematically shown as associated with heater 452 which delivers a heat input $Q_2$ to the feed line. The heater 452 is coupled via a signal transmission line 472 to the CPU 462, by which the heater may be actuated, or selectively modulated to provide a desired heat input to the feed line and fluid flowing therein. Alternatively, in lieu of a dedicated heater unit, the feed line 442 may be heat-traced, or contain a heating element for electrical resistance heating, or in other manner be arranged for heat input to maintain a predetermined temperature of the fluid flowed to the ALD unit.

The three-way valve 434 may be controlled by the CPU 162 via signal transmission line 470. The CPU 462 also is joined via signal transmission line 468 to valve 432 in discharge line 430, whereby the valve 432 can be selectively opened or closed to a desired extent, for delivery of source reagent vapor-containing fluid at a desired discharge flow rate.

The feed line 442 upstream of the ALD unit 460 contains a flow control valve 480 that is coupled via signal transmission line 482 to the CPU 462.

By the illustrated arrangement, the CPU functions as a control system for the process installation, to modulate flows of respective components, outputs of heaters, and additionally other instrumentation and control elements (not shown) that may usefully be deployed in the installation.

In operation, the vaporizer 400 is heated by heater 450 to a desired degree to generate vapor from the source reagent solids on the trays in vessel 402. Carrier gas from source 420 is flowed in line 422 into the interior volume of vessel 402 and flows outwardly and upwardly for contact with solids therein.

As a result, the carrier gas entrains vapor driving from the solids and the resulting fluid stream flows in discharge line 430 into feed line 442 and/or line 436 as required to effect a desired level of solids reduction in the fluid stream. The resulting solids-depleted stream flows into ALD unit 460 and is utilized therein for deposition of a component deriving from the source reagent on a substrate in the ALD chamber in such unit (not shown). The ALD unit thus may be operated at high efficiency as regards the reject rate of wafers processed therein, owing to the solids reduction achieved by the vapor delivery system as described.

The disclosure in another aspect relates to a vaporizer including a vaporizer vessel enclosing an interior volume and having at least one gas port communicating with the interior volume of the vessel, an interior structure in the interior volume of the vessel and contacting the vessel and an organocobalt source reagent material in contact with the interior structure, such source material including an outer crusted portion that is heatable to generate a source material vapor for egress from the vessel in dispensing operation of the vaporizer. The interior structure can include trays, metal foam, compartments, fins, extended area protrusions, etc., and the vessel can additionally include particle suppression feature(s) and/or frit element(s).

Figure 6:
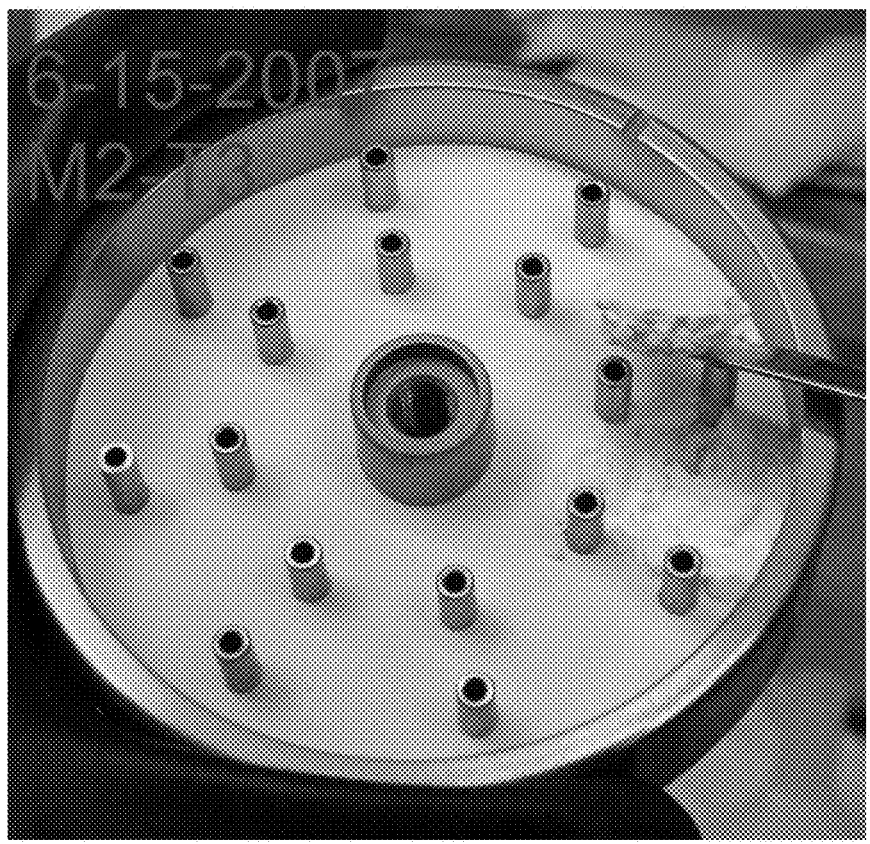
FIG. 6 is a perspective view photograph of a solid source reagent tray member of a type adapted to reside in a vaporizer vessel in accordance with the disclosure.

FIG. 6 is a perspective view photograph of a solid source reagent tray member of a type adapted to reside in a vaporizer vessel in accordance with the disclosure. The tray features a plurality of cylindrical flow channels therein to accommodate flow of vapor through the tray. A crusted portion of the source reagent is shown as having been removed from the bulk mass of the source reagent on the tray, following extended heat treatment of the source reagent to form such crusted material. Such removed portion of the source reagent material includes an uppermost layer that has been densified by heat treatment of the granular powder form of the source reagent as initially applied to the tray.

As used herein, the term "crust" refers to an outer portion of a mass of source reagent material, which in such outer portion has a morphologically different form than the source reagent material in the bulk interior or underlying portion of such mass. The morphologically different character of the crustal portion may be a difference in density, crystalline or amorphous character, microstructure, degree of divided or continuous character, or difference of divided and continuous character (such as wherein the crustal portion is fused or continuous, and the inner bulk portion is divided or discontinuous, e.g., granular or particulate in character).

The organocobalt source reagent material may be processed in any suitable manner to produce such crusted organocobalt source reagent material, at suitable temperature and for suitable time to achieve the crust overlying the bulk interior material of the organocobalt source reagent.

It will therefore be appreciated that organocobalt source reagent materials of the present disclosure may be processed, packaged and utilized in a variety of different implementations, to supply organocobalt material to a process tool or downstream process, such as a process for manufacturing semiconductor products, solar panels, flat-panel displays, or other products whose manufacture utilizes the organocobalt material to provide a desired cobalt film, component, or structure in the manufactured product.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. A process for depositing cobalt on a substrate, comprising contacting the substrate with cobalt precursor vapor under vapor deposition conditions effective for deposition of cobalt on the substrate, wherein the cobalt precursor comprises a cobalt precursor of the formula: $Co_2(CO)_6[(F_3C)C{\equiv}C(CF_3)]$.

2. The process of claim 1, wherein a cobalt or cobalt-containing film is deposited on the substrate in said contacting.

3. The process of claim 1, wherein a cobalt or cobalt-containing thin film is deposited on the substrate in said contacting.

4. The process of claim 1, wherein the cobalt is deposited on the substrate by chemical vapor deposition.

5. The process of claim 1, wherein the cobalt is deposited on the substrate by atomic layer deposition.

6. The process of claim 1, wherein the cobalt is deposited on the substrate by photo-assisted vapor deposition, plasma-assisted vapor deposition, or laser-assisted vapor deposition.

7. The process of claim 1, wherein the vapor deposition is carried out in a vapor deposition chamber to which the cobalt precursor vapor is flowed.

8. The process of claim 7, wherein the cobalt precursor vapor is delivered to the vapor deposition chamber by liquid delivery in which the cobalt precursor in a solvent medium is volatilized to form the cobalt precursor vapor.

9. The process of claim 8, wherein the solvent medium comprises a hydrocarbon solvent.

10. The process of claim 9, wherein said hydrocarbon solvent comprises an alkane.

11. The process of claim 9, wherein the hydrocarbon solvent comprises octane.

12. The process of claim 7, wherein the cobalt precursor vapor is delivered to the vapor deposition chamber by solid delivery in which the cobalt precursor is volatilized from a solid phase to form the cobalt precursor vapor.

13. The process of claim 7, wherein the cobalt precursor vapor is flowed to the vapor deposition chamber from a cobalt precursor package in which the cobalt precursor is adsorbed on a solid physical adsorbent material, and wherein the cobalt precursor is desorbed under dispensing conditions, for dispensing of the cobalt precursor vapor from the cobalt precursor package for flow to the vapor deposition chamber.

14. The process of claim 7, wherein the cobalt precursor vapor is flowed to the vapor deposition chamber from a cobalt precursor package in which the cobalt precursor is stored in an ionic liquid medium, and wherein the cobalt precursor is liberated from the ionic liquid medium under dispensing conditions, for dispensing of the cobalt precursor vapor from the cobalt precursor package for flow to the vapor deposition chamber.

15. The process of claim 7, wherein the cobalt precursor vapor is flowed to the vapor deposition chamber with a co-flow gas.

16. The process of claim 15, wherein the co-flow gas comprises one or more selected from the group consisting of argon, xenon, krypton, helium, hydrogen, nitrogen, carbon monoxide, oxygen, and carbon dioxide.

17. The process of claim 15, wherein the co-flow gas comprises a co-flow precursor for concurrent deposition of another metal to form a mixed metal alloy comprising cobalt on the substrate.

* * * * *